US006690236B2

United States Patent
Saito

(10) Patent No.: US 6,690,236 B2
(45) Date of Patent: Feb. 10, 2004

(54) GAIN VARIABLE AMPLIFIER

(75) Inventor: Shinji Saito, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/237,720

(22) Filed: Sep. 10, 2002

(65) Prior Publication Data

US 2002/0196080 A1 Dec. 26, 2002

Related U.S. Application Data

(63) Continuation of application No. 09/707,879, filed on Nov. 8, 2002, now Pat. No. 6,452,449.

(30) Foreign Application Priority Data

Jun. 30, 2000 (JP) ......................... 2000-198192

(51) Int. Cl.[7] ............................. H03F 3/45; G06F 7/44
(52) U.S. Cl. ................................. 330/254; 327/359
(58) Field of Search .......................... 330/254; 327/359

(56) References Cited

U.S. PATENT DOCUMENTS

| 4,928,074 | A | 5/1990 | Sato et al. ................ 330/254 |
| 4,978,924 | A | 12/1990 | Schuster ................... 330/254 |
| 5,874,857 | A | 2/1999 | Roth et al. ................ 330/254 |
| 5,907,261 | A | 5/1999 | Jones ...................... 330/254 |
| 5,994,961 | A | 11/1999 | Lunn et al. ............... 330/254 |
| 6,072,366 | A | 6/2000 | Maeda ..................... 330/254 |
| 6,091,275 | A | * 7/2000 | Behzad ................... 330/254 |
| 6,111,463 | A | 8/2000 | Kimura .................... 330/254 |
| 6,300,832 | B1 | 10/2001 | Okazaki ................... 330/254 |

* cited by examiner

Primary Examiner—Khanh Van Nguyen
(74) Attorney, Agent, or Firm—Arent Fox Kintner Plotkin & Kahn

(57) ABSTRACT

By a gain control circuit which has: a first differential input circuit comprising a differential pair of transistors Tr1 and Tr3 in which transistors Tr2 and Tr4 connected to diodes are inserted; a second differential input circuit comprising a pair of the transistor Tr3 and a transistor Tr5; and a current source circuit comprising a transistor Tr6 and an emitter resistor R3, and to which first to third individual control input signals VCLS1 to VCLS3 each having a predetermined inclination and an offset value, obtained by shifting the level of a control input signal VCNT are supplied, gain control signals VAGC having a linear characteristic, a monotone increase characteristic of which curve opens upwards, and a monotone increase characteristic of which curve opens sharply upwards are supplied in accordance with a monotone increase region of which curve opens upwards, a linear region, and a monotone increase region of which curve opens downwards, respectively, of a differential pair of transistors Tr11 and Tr12 and a differential pair of transistors Tr13 and Tr14 at the second stage of a differential amplification circuit.

1 Claim, 8 Drawing Sheets

METHOD OF ASSURING LINEARITY OF GAIN CHANGE IN CONVENTIONAL TECHNIQUE

PRINCIPLE OF ASSURING LINEARITY OF GAIN CHANGE IN ANOTHER CONVENTIONAL TECHNIQUE

EXAMPLE OF CIRCUIT OF ANOTHER CONVENTIONAL TECHNIQUE

FIG. 4 PRIOR ART OPERATIONS OF ANOTHER CONVENTIONAL TECHNIQUE

FIG. 5  PRINCIPLE OF OPERATION OF PRESENT INVENTION

CHARACTERISTICS OF GAIN CONTROL CIRCUITS IN EMBODIMENT

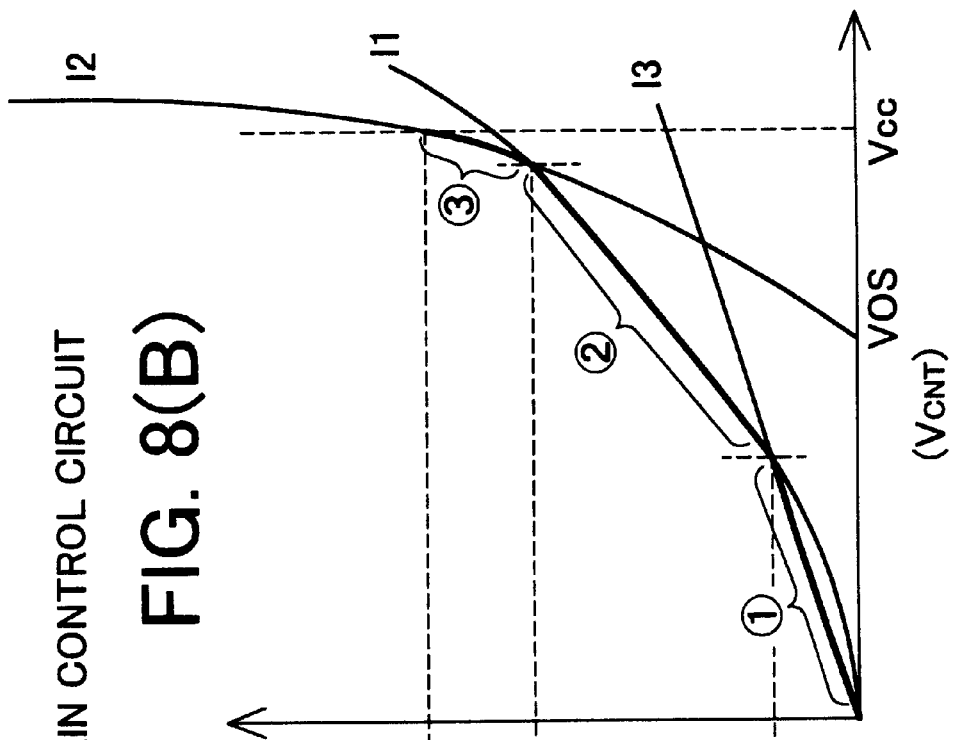
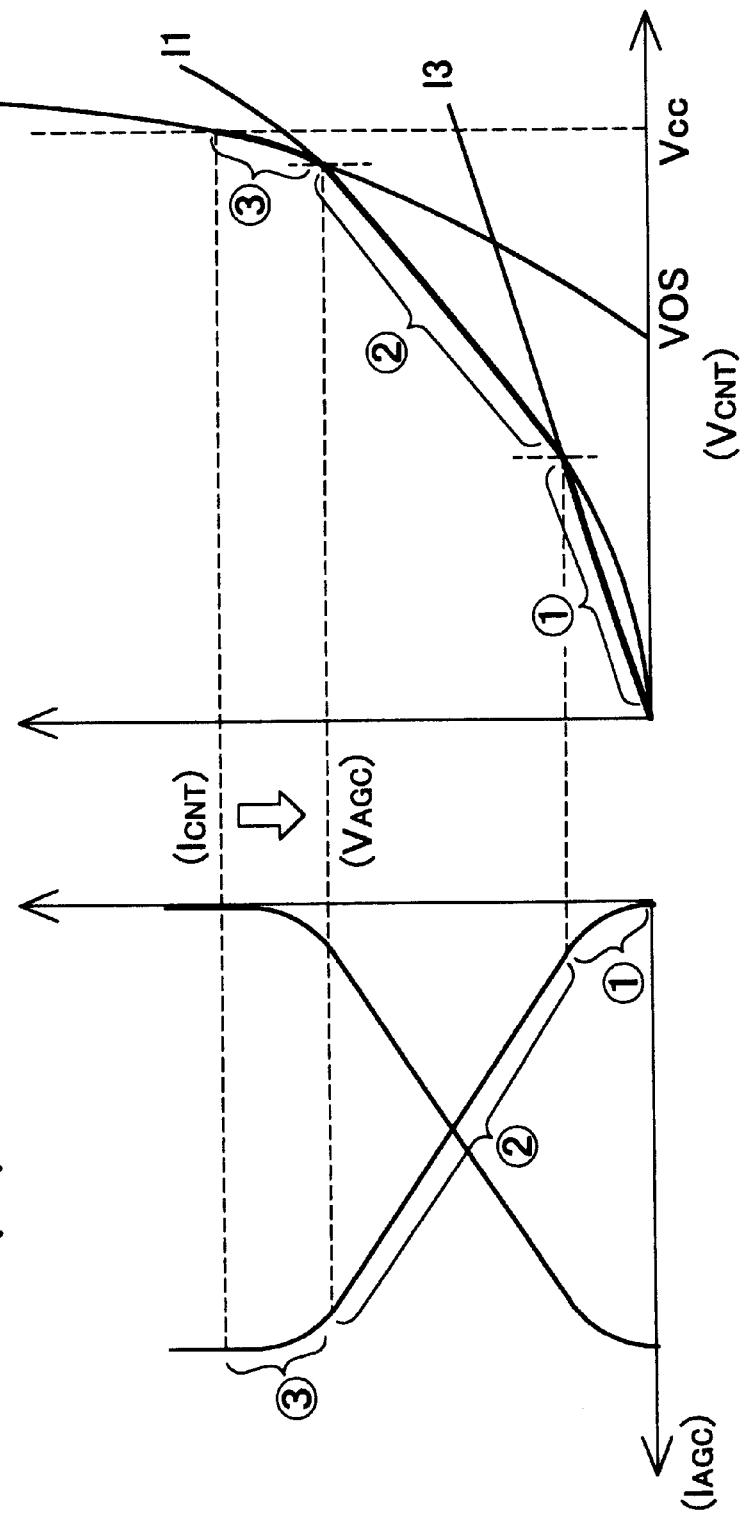
FIG. 8(A)
FIG. 8(B)
GAIN CONTROL METHOD OF GAIN CONTROL CIRCUIT

GAIN VARIABLE AMPLIFIER

This is a Continuation of Application No. 09/707,879 filed Nov. 8, 2002 now U.S. Pat. No. 6,452,449. The disclosure of the prior application(s) is hereby incorporated by reference herein in its entirety.

BACKGROUND OF THE INVENTION

1. Field of the Invention

The present invention relates to a gain variable amplifier for use in a communication device such as a portable telephone and, more particularly, to a gain variable amplifier with improved linearity of a power gain change.

2. Description of Related Art

In order to realize higher speech quality, a portable telephone in recent years is required to have the function of accurately controlling the strength of waves of transmission in accordance with the strength of waves received. In a gain variable amplifier used for each of transmitting and receiving units, it is therefore necessary to realize linearity of a power gain change over a wide wave strength range.

In a conventional gain variable amplifier, the linearity of a power gain change realized by an amplifier of one stage is limited. Consequently, as shown in FIG. 1A, amplifiers of multi-stages (two amplifiers Amp1 and Amp2 in FIG. 1A) are connected and gains of the amplifiers are added, thereby assuring the linearity of the power gain change in a wide range as a whole.

In another conventional technique, as an attempt to widen the linearity of the power gain change in the amplifier of one stage, as shown in an operating principle diagram of FIG. 2, in order to control the gain in a differential amplification circuit 10 in a gain variable amplifier 500, a response of a gain control signal VAGC to a control input signal VCNT of a gain control circuit 50 is controlled so as to be either linear or to have a monotone increase characteristic of which curve opens upwards in a linear coordinate system. FIG. 3 shows a specific example of such a circuit. In the circuit of FIG. 3, the gain control circuit 50 also has a differential input circuit configuration. An input voltage VCLS obtained by shifting the level of the control input signal VCNT so as to be linear by a level shifting circuit 51 is supplied to a differential pair in the gain control circuit 50. A specific operation is as shown in FIG. 4. The level of the input voltage VCLS obtained by the level shifting of the level shifting circuit 51 is shifted so that the input output characteristic of the gain control circuit 50 expresses a curve which opens upwards or is linear, thereby outputting the gain control signal VAGC having a response characteristic peculiar to the control input signal VCNT. By matching the characteristic with that of the differential amplification circuit 10, a linear gain change characteristic is realized.

Specifically, when the input voltage VCLS shifts from VA to VB with respect to the control input signal VCNT, an output current ICNT of the gain control circuit 50 has a monotone increase characteristic of which curve opens upwards. At the time of converting the output current ICNT to a voltage by a load resistor and outputting the voltage as the gain control signal VAGC, the gain control signal VAGC is adjusted so as to match the linear characteristic of the differential amplification circuit 10. Consequently, a monotone increase characteristic of which curve opens upwards can be obtained as an output characteristic of the differential amplification circuit 10. When the characteristic is expressed in decibels as the power gain, a linear gain change characteristic can be obtained in response to the control input signal VCNT.

When the input voltage VCLS is shifted from VB to VC with respect to the control input signal VCNT, the output current ICNT characteristic of the gain control circuit 50 becomes linear. When the characteristic is adjusted so as to match the monotone increase characteristic of which curve opens upwards of the differential amplification circuit 10, a monotone increase characteristic of which curve opens upwards is derived as an output characteristic of the differential amplification circuit 10. Thus, a linear gain change characteristic can be similarly obtained.

In the conventional techniques, the technique of connecting amplifiers of multi-stages has a problem that, since the number of component circuits is large, a number of components are necessary so that circuit layout is rigidly limited. Since current consumption is high, there is also a problem such that continuous use time of a portable device such as a portable telephone is limited, and it is also difficult to realize high density packing due to heat generated in association with current consumption.

In the another conventional technique in which the gain control is adjusted to attain the linear characteristic or the monotone increase characteristic of which curve opens upwards, only a limited region of the input output characteristics of the differential amplification circuit 10 is used. When the differential amplification circuit 10 is used beyond the region, the linearity of the gain change is lost and the circuit cannot be used. The region in the input output characteristics of the differential amplification circuit 10 which can realize the linearity is therefore limited and the linearity over a wide range cannot be assured. There is also a problem such that, since the differential amplification circuit is used within the narrow operating range of the gain control signal VAGC, it is difficult to assure sufficient operating accuracy.

SUMMARY OF THE INVENTION

The invention has been achieved to solve the problems of the conventional techniques and its object is to provide a gain variable amplifier of one stage capable of realizing linearity of a power gain change over a wide range by properly changing a gain control characteristic in response to a control input signal VCNT.

In order to achieve the object, according to one aspect of the invention, there is provided a gain variable amplifier comprising: a gain control circuit having a gain control characteristic of outputting a predetermined gain control signal in accordance with a control input signal; and a differential amplification circuit having an input output characteristic of varying a gain by switching a differential output current passing through a differential pair by the gain control signal, wherein the gain control circuit variably controls the gain control characteristic in accordance with the input output characteristic.

Consequently, the gain control circuit can properly vary the gain control characteristic of the gain control signal in response to the control input signal in accordance with the input output characteristic of the differential amplification circuit. A predetermined gain change characteristic can be therefore given to the control input signal and the linear gain change over a wide input output range of the differential amplification circuit can be realized.

According to another aspect of the invention, in the gain variable amplifier, when the gain control signal is supplied to the differential amplification circuit and is in a first region in which the input output characteristic is a linear characteristic in a linear coordinate system, the gain control circuit variably controls the gain control characteristic so as to be a first monotone increase control characteristic of which curve opens upwards in a linear coordinate system, when the gain control signal is supplied to the differential amplification circuit and is in a second region in which the input output characteristic is a monotonous increase characteristic of which curve opens downwards in a linear coordinate system, the gain control circuit variably controls the gain control characteristic to a second monotone increase control characteristic of which curve is sharper than that of the first monotone increase control characteristic, and when the gain control signal is supplied to the differential amplification circuit and is in a third region in which the input output characteristic is a monotone increase characteristic of which curve opens upwards in a linear coordinate system, the gain control circuit variably controls the gain control characteristic to be a linear control characteristic.

In the first region in which the input output characteristic of the differential amplification circuit is linear, the gain control circuit variably controls the gain control characteristic so as to be a first monotone increase control characteristic of which curve opens upwards in the linear coordinate system. In the second region in which the input output characteristic of the differential amplification circuit is a monotone increase characteristic of which curve opens downwards in the linear coordinate system, the gain control circuit variably controls the gain control characteristic to a second monotone increase control characteristic of which curve is sharper than that of the first monotone increase control characteristic. In the third region in which the input output characteristic of the differential amplification circuit is a monotone increase characteristic of which curve opens upwards in the linear coordinate system, the gain control circuit can variably control the gain control characteristic to be a linear control characteristic. Since the gain control characteristic can be optimally set over the entire range of the input output characteristic of the differential amplification circuit, the linearity of the gain change can be maintained over the entire region and the linearity over a wide range can be assured.

According to further another aspect of the invention, in the gain variable amplifier, the gain control circuit can have a transconductance amplifier construction, and variably control the gain control characteristic by varying a conductance characteristic of the transconductance amplifier construction.

By varying the conductance characteristic, a current output of the transconductance amplifier construction can be freely set in response to the control input signal, the current can be converted to a voltage, and the voltage can be used as a gain control signal. Consequently, the optimum gain control characteristic can be easily and certainly obtained over a wide range in the input output characteristic of the differential amplification circuit, and the linearity of the gain change over a wide range can be assured.

According to further another aspect of the invention, in the gain variable amplifier, the transconductance amplifier construction can have a composite differential input circuit of multiple inputs, and an individual control input signal having a predetermined inclination and a predetermined offset value can be supplied in response to each input signal supplied to the composite differential input circuit.

By supplying the individual control input signal which has a predetermined inclination and a predetermined offset value and which changes linearly to each of inputs of the composite differential input circuit of multiple inputs, the operation of the composite differential input circuit can be switched according to the output current response of the composite differential input circuit according to the predetermined inclination of the individual control input signal and the predetermined offset value by a sum of the output currents of differential pairs of the composite differential input circuit. Therefore, the input output characteristics of the differential pairs of the composite differential input circuit can be freely combined by a simple linearity change in response to the individual input signal, the optimum gain control characteristic is easily obtained over a wide range in the input output characteristic of the differential amplification circuit, and the linearity of the gain change over a wide range can be assured.

According to further another aspect of the invention, in the gain variable amplifier, the gain control circuit comprises: a first transistor and a second transistor constructing a differential pair; a first diode whose anode is connected to an emitter of the first transistor; a second diode whose anode is connected to an emitter of the second transistor; a third transistor; a first differential input circuit in which a cathode of the first diode and a cathode of the second diode are connected to each other, a reference voltage is applied to a base of the first transistor, and a first individual control input signal is supplied to a base of the second transistor; a second differential input circuit in which an emitter of the third transistor is connected to the cathodes of the first and second diodes, the cathodes being connected to each other, a second individual control input signal is supplied to a base of the third transistor, the circuit being achieved with the first transistor; the composite differential input circuit being constructed by the first and second differential input circuits; a fourth transistor; and a resistor connected to an emitter of the fourth transistor. A current source circuit of a predetermined conductance is formed by connecting the other end of the resistor to a reference potential and supplying a third individual control input signal to a base of the fourth transistor, and a sum of an output current of the first differential input circuit, an output current of the second differential input circuit and an output current of the current source circuit is converted to a voltage and the voltage is outputted as the gain control signal.

By supplying the first individual control input signal to the base of the second transistor, the output current of the first differential input circuit has the first monotone increase control characteristic of which curve opens upwards in the linear coordinate system. By supplying the second individual control input signal to the base of the third transistor, the output current of the second differential input circuit has the second monotone increase control characteristic of which curve is sharper than that of the first monotone increase control characteristic. By supplying the third individual control input signal to the base of the fourth transistor, the output current of the current source circuit constructed by the fourth transistor and the resistor connected to the emitter has the linear control characteristic. By the above setting, as the sum of the output currents having the control characteristics by adjusting the inclination of the individual control input signals and the offset values, the gain control characteristic can be switched from the linear control characteristic via the first monotone increase control characteristic to the second monotone increase control. By the combination of the input output characteristics of the differential amplification circuit, the linearity of the gain change can be maintained over the entire range and the linearity over a wide range can be assured.

In the first differential input circuit, the first and second diodes are connected in the forward direction to the emitters of the first and second transistors constructing the differential pair. Consequently, the operating point of the differential pair can be set higher only by an amount corresponding to the forward voltage of the diodes, and the first individual control input signal to be supplied to the base of the second transistor can be set to a high voltage level. Thus, the operating range of the first individual control input signal can be set to a very accurate voltage range for the signal generating circuit, and the linearity of the gain change characteristic can be realized with higher accuracy.

The circuit constructions can be easily realized by using bipolar transistors.

According to further another aspect of the invention, in the gain variable amplifier, the gain control circuit comprises: a first transistor and a second transistor which form a differential pair; a first diode whose anode is connected to a source of the first transistor; a second diode whose anode is connected to a source of the second transistor; a third transistor; a first differential input circuit in which a cathode of the first diode and a cathode of the second diode are connected to each other, a reference voltage is applied to a gate of the first transistor, and a first individual control input signal is supplied to a gate of the second transistor; a second differential input circuit in which a source of the third transistor is connected to the cathodes of the first and second diodes, the cathodes being connected to each other, a second individual control input signal is supplied to a gate of the third transistor, the circuit being achieved with the first transistor; and the composite differential input circuit being constructed by the first and second differential input circuits. A sum of an output current of the first differential input circuit and an output current of the second differential input circuit is converted to a voltage and the voltage is outputted as the gain control signal.

By supplying the first individual control input signal to the gate of the second transistor, the output current of the first differential input circuit is set to have the first monotone increase control characteristic of which curve opens upwards in the linear coordinate system. By supplying the second individual control input signal to the gate of the third transistor, the output current of the second differential input circuit is set to have the second monotone increase control characteristic of which curve is sharper than that of the first monotone increase control characteristic. Further, when it is set to use the linear region of the first or second differential input circuit as a linear control characteristic, as a sum of the output currents having the control characteristics by adjusting the inclination of each of the individual control input signals and the offset value, the gain control characteristic can be switched from the linear control characteristic via the first monotone increase control characteristic to the second monotone increase control characteristic. The linearity of the gain change can be maintained over the entire region by the combination with the input output characteristic of the differential amplification circuit, and the linearity over a wide range can be assured.

In the first differential input circuit, the first and second diodes are connected in the forward direction to the sources of the first and second transistors constructing the differential pair. Consequently, the operating point of the differential pair can be set higher only by an amount corresponding to the forward voltage of the diodes, and the first individual control input signal to be supplied to the gate of the second transistor can be set to a high voltage level. Thus, the operating range of the first individual control input signal can be set to a very accurate voltage range for the signal generating circuit, and the linearity of the gain change characteristic can be realized with higher accuracy.

The circuit constructions can be easily realized by using MOS transistors.

According to further another aspect of the invention, the gain variable amplifier further comprises a level shifting circuit. The individual control input signal having a predetermined inclination and a predetermined offset value can be generated by shifting the level of the control input signal.

Since the gain variable amplifier is provided with the level shifting circuit, the control input signal can be subjected to the level shifting to thereby obtain an individual control input signal having a predetermined inclination and a predetermined offset value. Thus, the linearity over a wider range can be assured by a single control input signal.

The above and further objects and novel features of the invention will more fully appear from the following detailed description when the same is read in connection with the accompanying drawings. It is to be expressly understood, however, that the drawings are purpose of illustration only and not intended as a definition of the limits of the invention.

BRIEF DESCRIPTION OF THE DRAWINGS

FIGS. 8A and 8B are operation explaining diagrams showing a gain control method of the gain control circuit.

DETAILED DESCRIPTION OF THE PREFERRED EMBODIMENTS

Figure 1A:
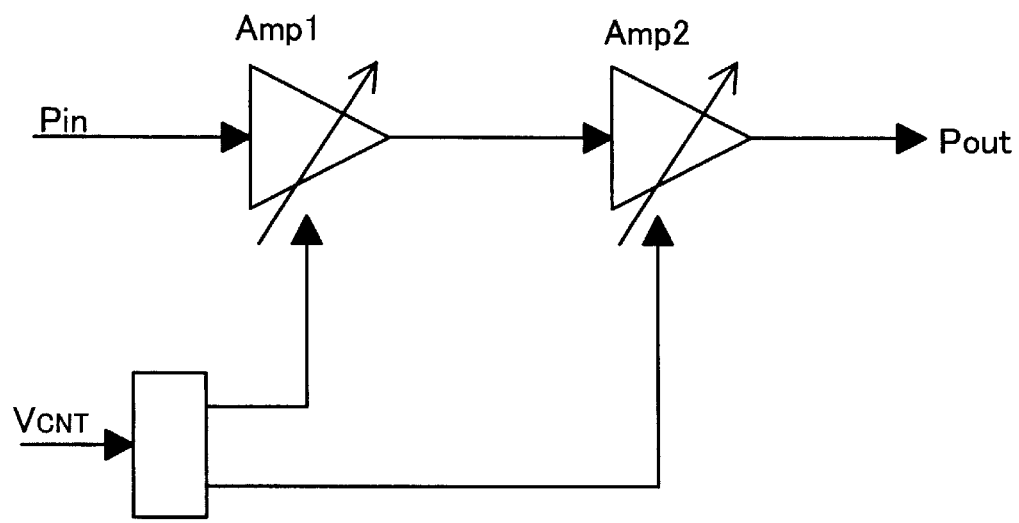
FIGS. 1A and 1B are conceptual diagrams showing a method of assuring the linearity of a gain change in a conventional technique.
Figure 1B:
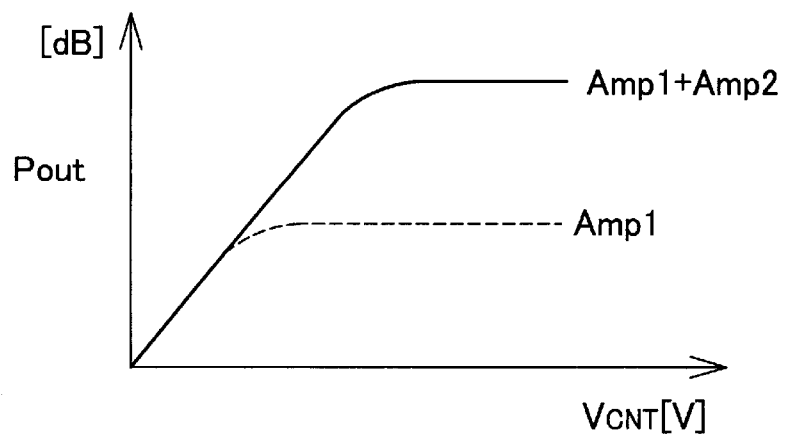
Figure 2:
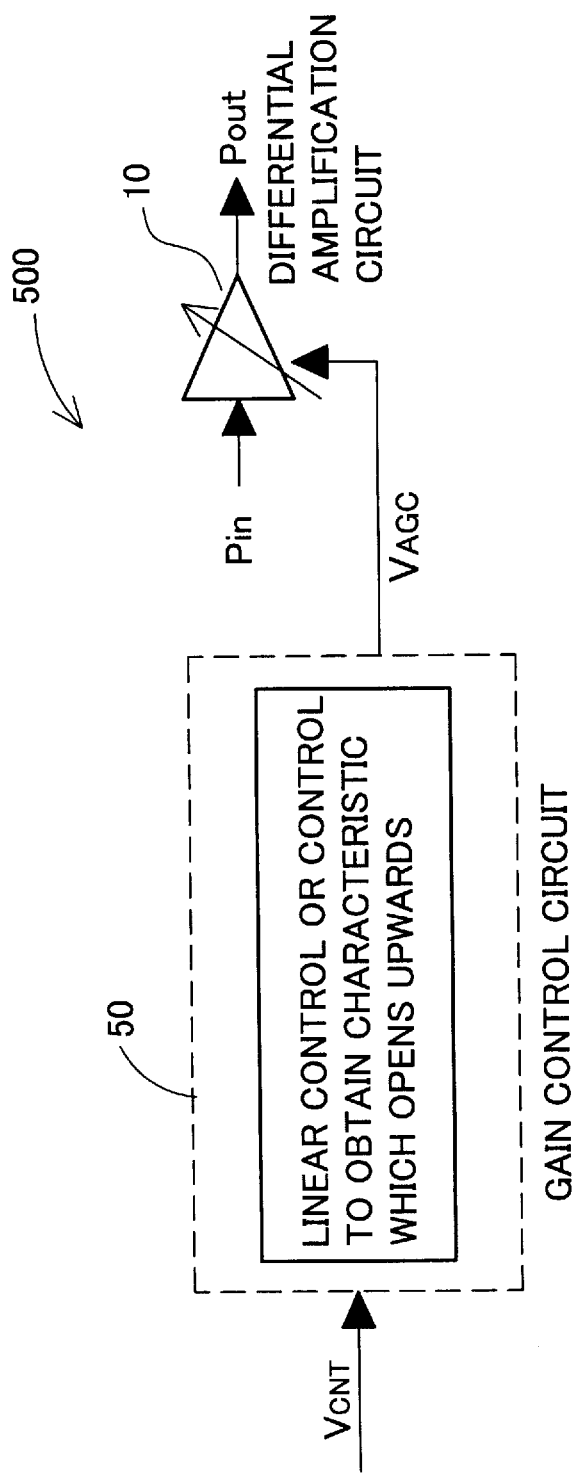
FIG. 2 is a diagram of the principle of assuring the linearity of a gain change in another conventional technique.
Figure 3:
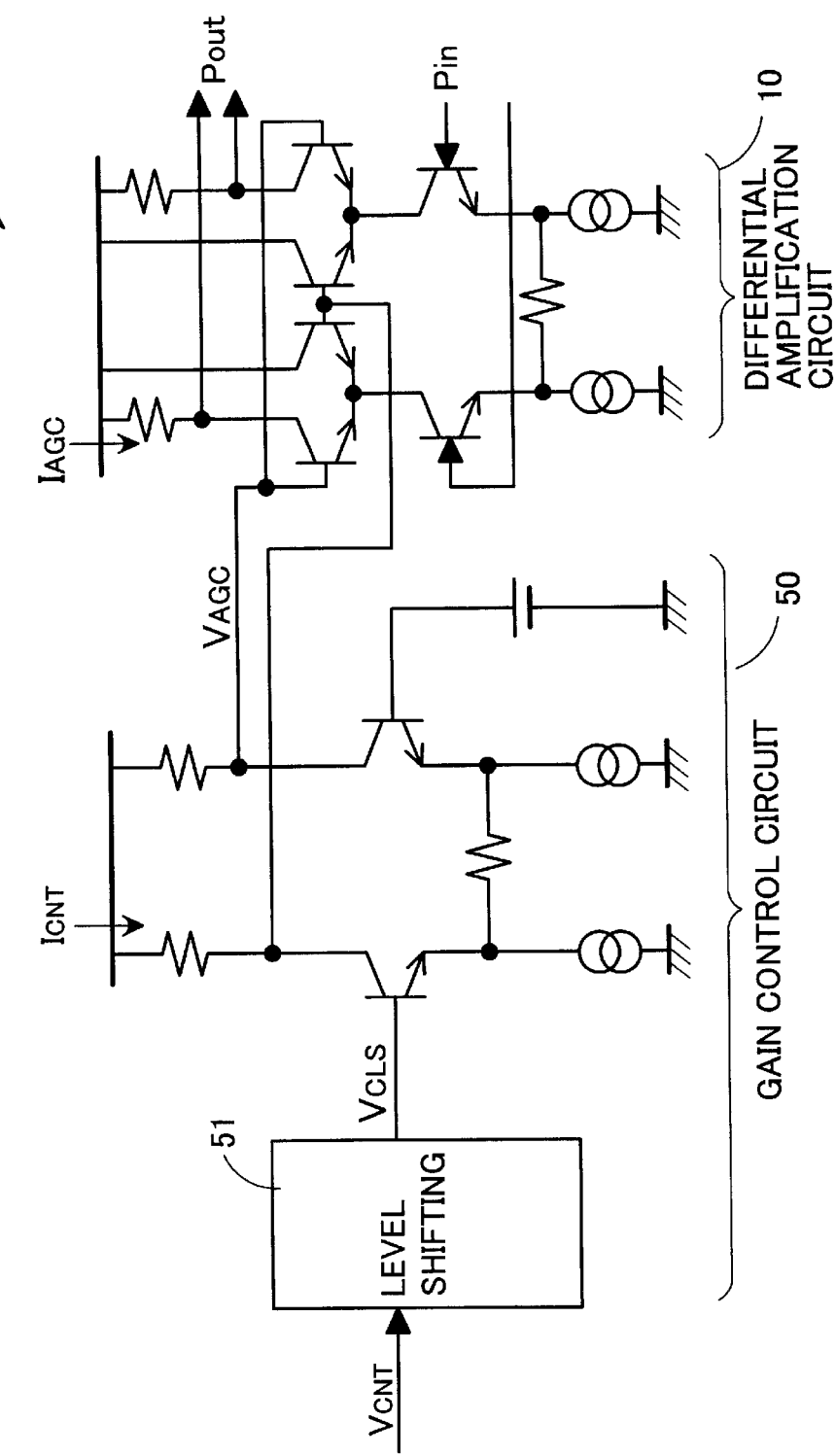
FIG. 3 shows an example of a circuit of the another conventional technique.
Figure 4:
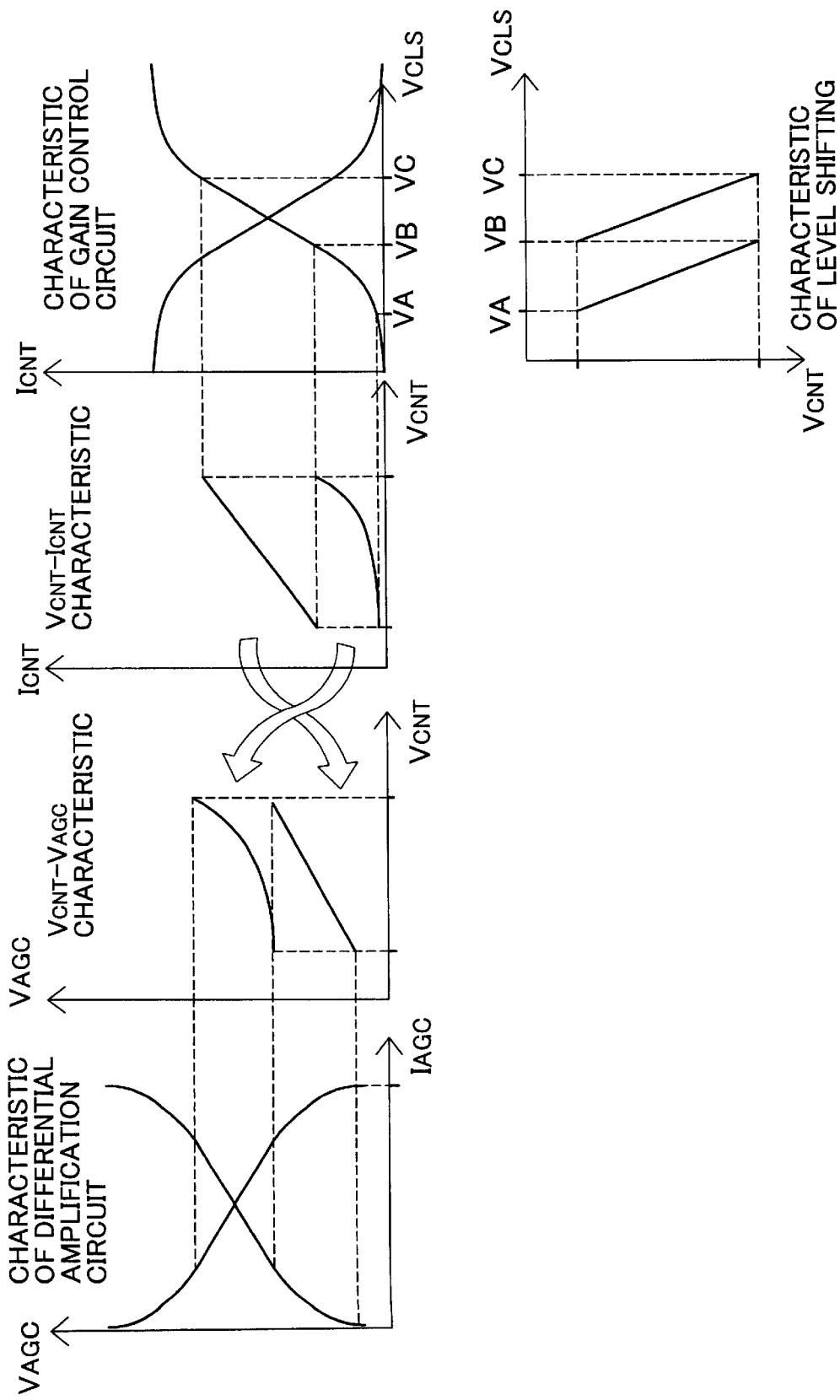
FIG. 4 is a diagram for describing the operations of the example of the circuit of the another conventional technique.
Figure 5:
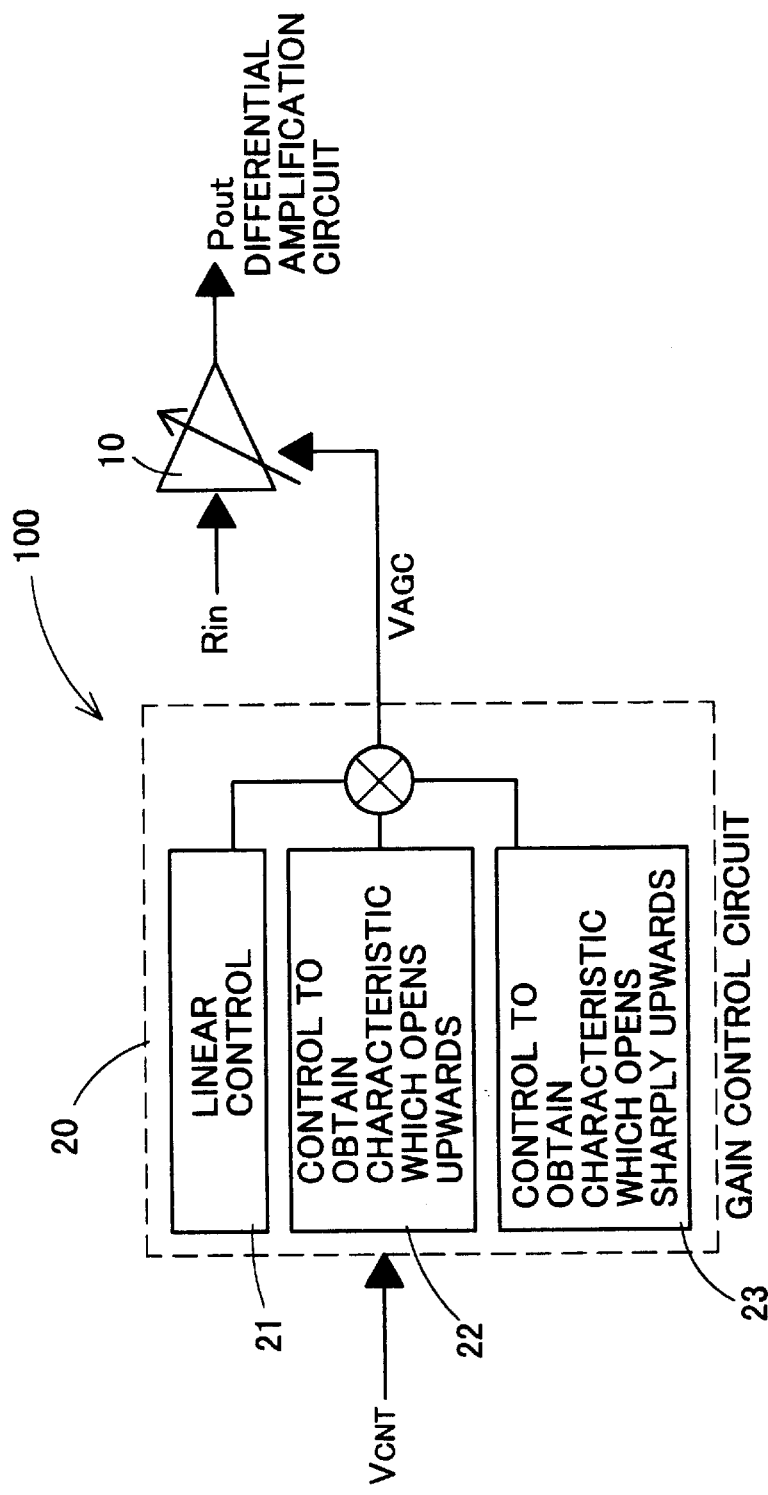
FIG. 5 is a diagram showing the principle of operation of the present invention.
Figure 6:
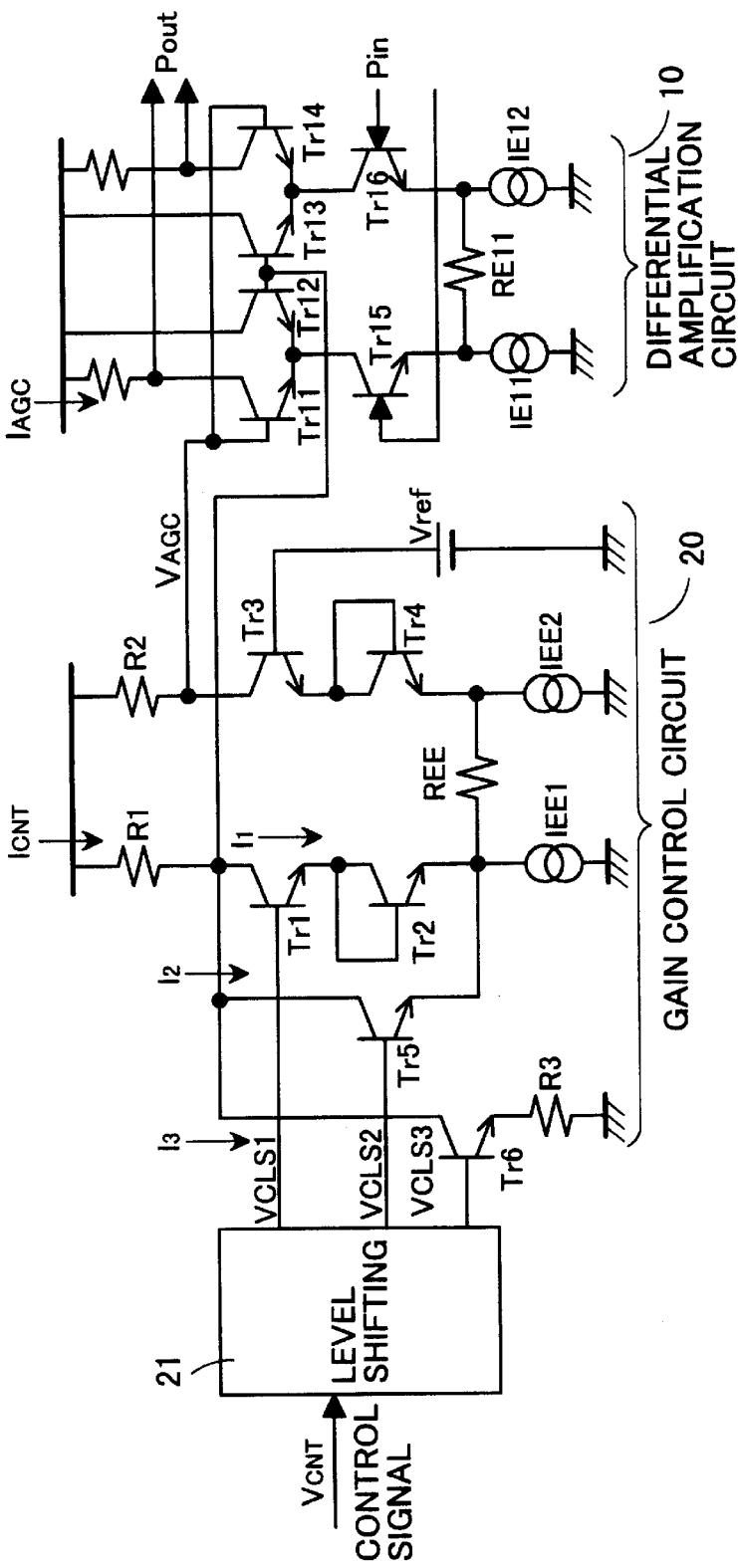
FIG. 6 is a circuit diagram showing a gain variable amplifier according to an embodiment of the invention.
Figure 7A:
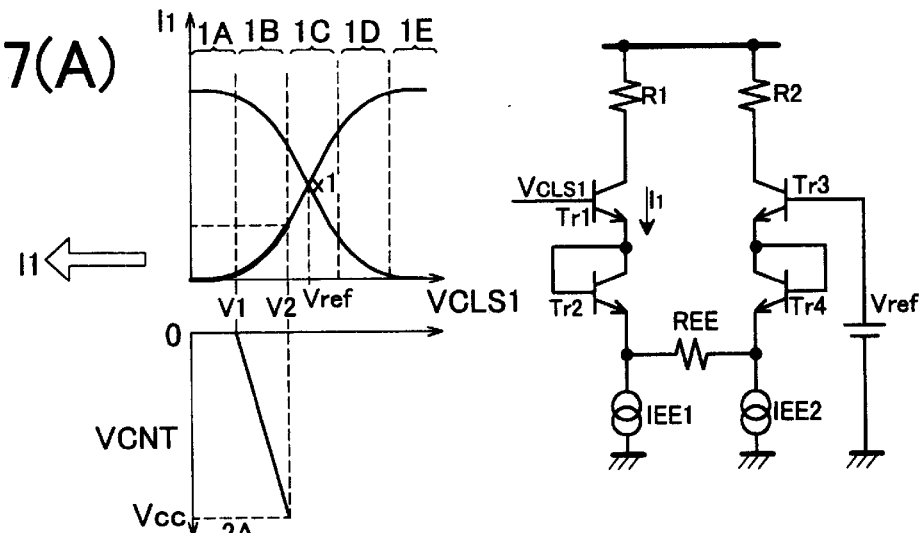
FIGS. 7A to 7C show circuit characteristics of gain control circuits in the embodiment.
Figure 7B:
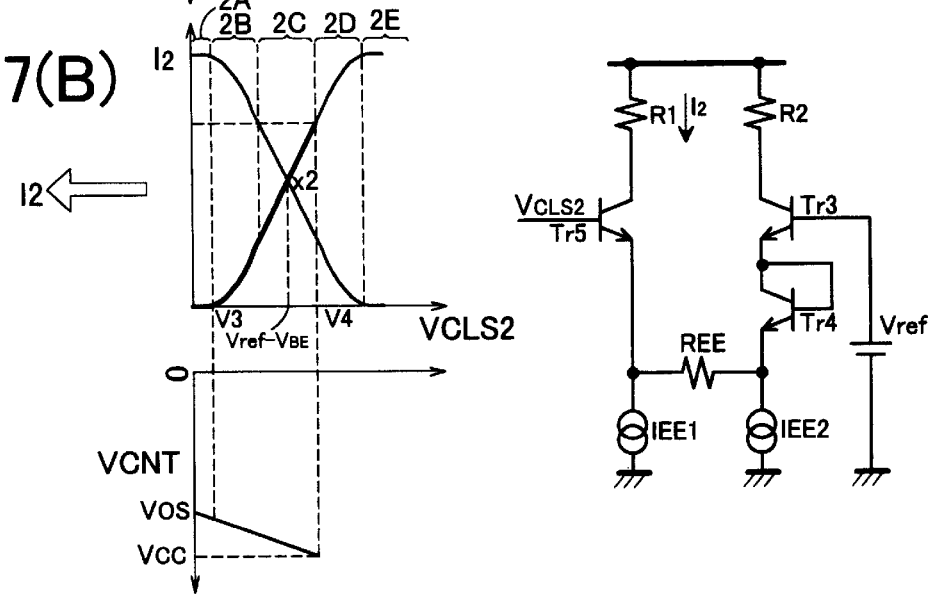
Figure 7C:
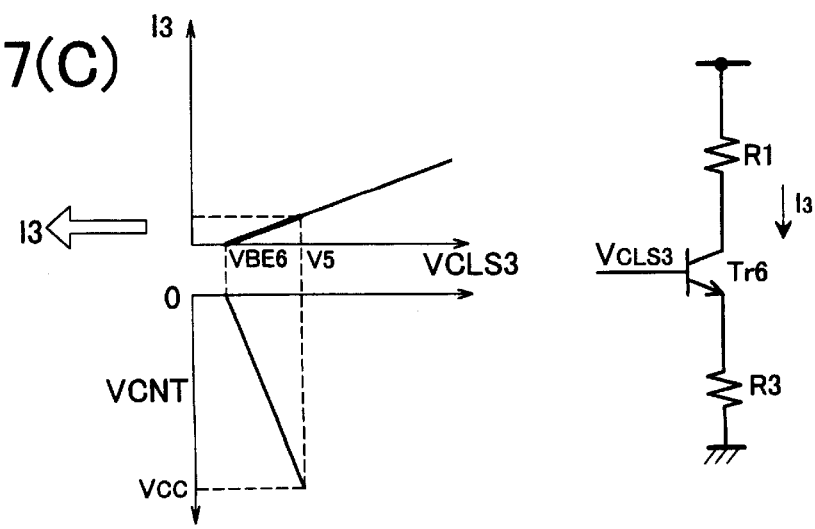

An embodiment of a gain variable amplifier of the invention will be described in detail hereinbelow with reference to FIGS. 5 to 8. FIG. 5 is a diagram showing the principle of operation of the invention. FIG. 6 is a circuit diagram showing a gain variable amplifier according to the embodiment of the invention. FIGS. 7A through 7C show circuit characteristics of gain control circuits in the embodiment. FIGS. 8A and 8B show an operation explaining diagram showing a gain control method of the gain control circuit.

A gain variable amplifier 100 shown in FIG. 5 comprises: a differential amplification circuit 10 for amplifying power; and a gain control circuit 20 for variably controlling the characteristics in response to the control input signal VCNT of a gain coefficient in the differential amplification circuit 10. The differential amplification circuit 10 obtains a power gain by changing a differential current by switching a path of an emitter bias current between a differential pair in accordance with a differential input voltage supplied to the differential pair. The gain control circuit 20 is a circuit for controlling the gain by outputting the gain control signal VAGC which is supplied as a differential input voltage of the differential amplification circuit 10 in response to the control input signal VCNT. The gain control circuit 20 has the control characteristic such that the gain control characteristic is sequentially switched from a linear control via a monotone increase control which opens upwards to a monotone increase control which opens sharply upwards. By variably controlling the gain control characteristic in accordance with the input output characteristics of the differential pair for setting a gain coefficient in the differential amplification circuit 10, a linear power gain change characteristic is obtained over a wide operating range of the differential pair. The monotone increase which opens upwards denotes response characteristics such that both a derivative of the first order and a derivative of the second order are positive in a linear-scale coordinate system. The monotone increase which opens downwards denotes response characteristics such that a derivative of the first order is positive and a derivative of the second order is negative in a linear-scale coordinate system.

FIG. 6 shows a specific example of the circuits. The differential amplification circuit 10 has differential pairs of two stages. Emitter current sources IE11 and IE12 are connected to the emitters of a differential pair of transistors Tr15 and TR16 at the first stage, and a bias current in the differential amplification circuit 10 is supplied. The emitters are bridged via an emitter resistor RE11 and an input Pin is supplied across the bases of the differential pair of transistors Tr15 and Tr16. Since a differential voltage of the input Pin is applied across the resistor RE11, a current proportional to the differential voltage bypasses from the emitter current sources IE11 and IE12 and passes through the resistor RE11, and a current which is twice as large as the current passing through the resistor RE11 is outputted to the collectors of the transistors Tr15 and TR16 of the differential pair. That is, a power gain proportional to the resistor RE11 is set as a reference power gain by the differential pair of transistors Tr15 and Tr16 at the first stage.

A pair of differential currents from the differential pair of transistors Tr15 and Tr16 at the first stage, which are outputted as a reference power gain are supplied as bias currents to two differential pairs of transistors Tr11 and Tr12 and transistors Tr13 and Tr14 at the second stage. A gain control signal VAGC from the gain control circuit 20 is supplied to the bases of the differential pair of transistors Tr11 and Tr12 and the differential pair of transistors Tr13 and Tr14 at the second stage. A pair of differential currents from the differential pair of transistors Tr15 and Tr16 at the first stage is further diverted in each of the differential pairs according to a differential voltage of the gain control signal VAGC, and the resultant current is outputted from each of the transistors Tr11 and Tr14. The differential pair of transistors Tr11 and Tr12 and that of transistors Tr13 and Tr14 have the same construction and are connected to peripheral circuits in the same manner. Consequently, currents outputted from the transistors Tr11 and Tr14 are converted to voltages by load resistors R11 and R12, respectively, and the voltages are outputted as gains according to the differential voltage of the gain control signal VAGC and input output characteristics of the differential pair of transistors Tr11 and Tr12 and the differential pair of transistors Tr13 and Tr14 at the second stage. As will be described hereinlater, since the input output characteristics of the pair of differential transistors Tr11 and Tr12 and the pair of differential transistors Tr13 and Tr14 at the second stage display the characteristics of a differential input circuit, by changing the response characteristics of the gain control signal VAGC with respect to three regions, the linearity of a power gain change is realized. The three regions are: a linear characteristic region in which the differential voltage of the gain control signal VAGC is around zero; a region of the monotone increase which opens downwards, which is on the outside of the linear characteristic region and in which the differential voltage is in a positive region; and a region of a monotone increase which opens upwards, in which the differential voltage is in a negative region.

The gain control circuit 20 is a circuit for changing the response characteristic of the gain control signal VAGC in accordance with the input output characteristics of the differential input circuit. A differential amplification circuit comprises the transistors Tr1 and Tr3 which construct the differential pair, the emitter current sources IEE1 and IEE2, the emitter resistor REE, and the load resistors R1 and R2 for voltage conversion. In addition, the transistors Tr2 and Tr4 that work as diodes for level shifting are inserted between the differential pair of transistors Tn and Tr3 and the emitter current sources IEE1 and IEE2, thereby forming a first differential input circuit. The transistor Tr3 is on the reference side of the differential pair. A reference voltage Vref is supplied to the transistor Tr3. A first individual control input signal VCLS1 obtained by shifting the level of the control input signal VCNT by the level shifting circuit 21 is supplied to the transistor Tr1 side. Although a differential output current I1 is converted to a voltage by the load resistors R1 and R2 and outputted for the gain control signal VAGC, the signal is adjusted by the first individual control input signal VCLS1 in the first differential input circuit so that the monotone increasing characteristic which opens upwards is outputted.

In the first differential input circuit, the transistors Tr2 and Tr4 that work as diodes are connected in the forward direction to the differential pair of transistors Tr1 and Tr3. An operating point of the differential pair of transistors Tr1 and Tr3 can be set high only by an amount corresponding to a forward voltage of the diodes, and a voltage level of the first individual control input signal VCLS1 can be set to a high level. Consequently, the operating range of the first individual control input signal VOLS1 can be adjusted to a voltage range in which accuracy is high for the level shifting circuit 21 is high, and the operating accuracy of the first differential input circuit in the gain control circuit 20 can be improved.

The emitter of the transistor Tr5 is directly connected to the emitter current source IEE1. The transistors Tr5 and Tr3 construct a second differential input circuit. The second differential input circuit has input output characteristics having a voltage as a cross point, obtained by dropping the reference voltage Vref on the transistor Tr3 side only by an amount corresponding to a forward voltage Vbe4 of the transistor Tr4 that works as a diode. A second individual control input signal VCLS2 to be supplied to the transistor Tr5 is a signal obtained by sharply shifting the level of the control input signal VCNT by the level shifting circuit 21 so as to include the cross point voltage. The second individual control input signal VCLS2 is adjusted so that a differential output current I2 having a monotone increase characteristic which is sharper than that of the differential output current I1 is outputted.

Further, the emitter of the transistor Tr6 is connected to the ground via the emitter resistor R3, thereby forming a current source circuit from which a current proportional to a base voltage is outputted. In the current source circuit, by applying a voltage obtained by dropping a third individual control input signal voltage VCLS3 to be inputted to the base of the transistor Tr6 only by an amount corresponding to a base-emitter forward voltage Vbe6 of the transistor Tr6 to the resistor R3, an output current I3 is determined. That is, the output current I3 is proportional to a third individual control input signal VCLS3 with an offset of a base-emitter forward voltage Vbe6. The third individual control input signal VCLS3 is obtained by shifting the level of the control input signal VCNT by the level shifting circuit 21. The output current I3 having a linear characteristic is outputted.

Each of the first to third individual control input signals VCLS1 to VCLS3 is a signal generated by giving a predetermined inclination and a predetermined offset value to the control input signal VCNT supplied from the outside by the level shifting circuit 21. It is sufficient to shift the level of the control input signal VCNT so as to be linear. The level shifting circuit 21 can be realized with a simple circuit construction having a resistive potential divider as a main component. It is unnecessary to provide the level shifting circuit 21 in the variable gain amplifier 100. A signal generated on the outside may be directly supplied to the gain control circuit 20 in the variable gain amplifier 100.

A specific operation will be described hereinbelow with reference to FIGS. 7A to 7C and FIGS. 8A and 8B. FIGS. 7A to 7C are characteristic diagrams showing input output characteristics of the first differential input circuit, the second differential input circuit, and the current source circuit in FIG. 6. The upper parts of FIGS. 7A to 7C show input output characteristics of output currents in response to the first to third individual control input signals VCLS1 to VCLS3, respectively. The lower parts of FIGS. 7A to 7C show input output characteristics of the level shifting circuit 21 expressing responses of the first to third individual control individual control input signals VCLS1 to VCLS3 to the control input signal VCNT. In FIGS. 7A to 7C, for convenience, each of drawings of the input output characteristics of the level shifting circuit 21 in the lower parts is turned by 90 degrees so that its axis coincides with the axis of each of the first to third individual control input signals VCLS1 to VCLS3 in the upper parts.

The first differential input circuit is a regular differential input circuit. The input output characteristics of the first differential input circuit are that, as shown in the upper part of FIG. 7A, a differential current is balanced at a point (point X1 in the drawing) at which the differential voltage VCLS1 is equal to the reference voltage Vref of the first differential input circuit. The input output characteristics are divided into five regions around the point X1 as a center. Specifically, in a linear region 1C in which the first differential input circuit performs a linear operation around the point X1 as a center, the input output characteristics are linear. When the differential voltage VCLS1 increases beyond the linear region 1C, the driving ability of the transistor Tr1 to which the differential voltage VCLS1 is inputted becomes high relative to the transistor Tr3 in the pair of differential transistors Tr1 and Tr3. Consequently, the input output characteristics shift to a region 1D indicating monotone increasing characteristics of which curve open downwards. On the contrary, when the differential voltage VCLS1 falls short of the linear region 1C and increases in the opposite direction, the driving ability of the transistor Tr1 to which the differential voltage VCLS1 is supplied becomes low relative to the transistor Tr3 in the pair of transistors Tr1 and Tr3. The input output characteristics therefore shift to a region 1B showing monotone increasing characteristics of which curve opens upwards. When the differential voltage VCLS1 further increases in either the positive or negative direction, one of the transistors Tr1 and Tr3 in the differential pair enters a complete off state (when the differential voltage VCLS1 increases in the positive direction, the transistor Tr3 is turned off and the input output characteristics shift to the region 1E, and when the differential voltage VCLS1 increases in the opposite direction, the transistor Tr1 is turned off and the input output characteristics shift to the region 1A).

With respect to the first differential input circuit having such a characteristic, by performing the level shifting in the level shifting circuit 21, the level of the first individual control input signal VCLS1 is shifted from V1 to V2 for 0 V of the control input signal to the VCC level. In the voltage region, the input output characteristics of the first differential input circuit correspond to the monotone increase region 1B in which the curve of the differential output current I1 opens upwards. During the control input signal VCNT sweeps from 0 V to the VCC level, the differential output current I1 has the monotone increase characteristic of which curve opens upwards.

The operation of the second differential input circuit is similar to the above. The input output characteristics of the second differential input circuit are, as shown in the upper part of FIG. 7B, the differential current is balanced at a point (point X2 in the drawing) at which the differential voltage VCLS2 is dropped from the reference voltage Vref of the second differential input circuit only by an amount corresponding to the forward voltage Vbe4 of the transistor Tr4 that works as a diode. The input output characteristics are divided into five regions by using the point X2 as a center. In a linear region 20 in which the second differential input circuit performs a linear operation around the point X2 as a center, the input output characteristics are linear. When the differential voltage VCLS2 increases beyond the linear region 20, the driving ability of the transistor Tr5 to which the differential VCLS2 is supplied in the differential pair of the transistors Tr5 and Tr3 becomes high relatively. The input output characteristics therefore shift to a region 2D showing a monotone increase characteristic of which curve opens downwards. On the contrary, when the differential voltage VCLS2 goes below the linear region 20 and increases in the opposite direction, the driving ability of the transistor Tr5 to which the differential voltage VCLS2 is supplied in the differential pair of transistors Tr5 and Tr3 becomes relatively low. The input output characteristic therefore shift to a region 2B showing a monotone increase characteristic of which curve opens upwards. Further, when the differential voltage VCLS2 further increases in either the positive or opposite direction, one of the transistors Tr5 and Tr3 in the differential pair is completely turned off (when the differential voltage VCLS2 increases in the positive direction, the transistor Tr3 enters an off state and the input output characteristics shift to a region 2E, and when the differential voltage VCLS2 increases in the opposite direction, the transistor Tr5 enters an off state and the input output characteristics shift to a region 2A).

With respect to the second differential input circuit having such a characteristic, by performing the level shifting by the level shifting circuit 21, the level is shifted so as to sharply increase the level of the second individual control input signal VCLS2 from 0 V to V4 with an offset voltage VOS for the control input signal VCNT of 0 V to VCC level. In the voltage region, in the input output characteristics of the second differential input circuit, although the differential output current I2 shifts from the off state 2A via the monotone increase region 2B of which curve opens upwards to the linear region 2C, the differential output current I2 rises during a period in which the control input signal VCNT sharply shifts from the offset voltage VOS to the VCC level. Consequently, the second differential input circuit has a monotone increase characteristic of which curve opens upwards more sharply as compared with the characteristic of the differential output current I1.

Further, the input output characteristic of the current source circuit is a linear characteristic having an inclination specified by the emitter resistor R3 as shown in the upper part of FIG. 7C. The differential voltage VCLS3 starts flowing at a point the differential voltage VCLS3 exceeds the base-emitter forward voltage Vbe6 of the transistor Tr6 in the current source circuit.

With respect to the current source circuit having the characteristic, by shifting the level by the level shifting circuit 21, for the control input signal VCNT from 0 V to the VCC level, the level of the third individual control input signal VCLS3 is shifted from Vbe6 to V5. The input output characteristic of the current source circuit is linear, and the circuit has a linear output current I3 characteristic determined by the emitter resistor R3 in response to an application voltage (VCLS3-Vbe6).

FIG. 8A shows the control input signal VCNT characteristics of the three output currents I1, I2 and I3. The sum of the currents I1, I2 and I3 becomes an output current of the gain control circuit 20, the output current is converted to a voltage by the load resistors R1 and R2, the voltage is supplied as the gain control signal VAGC to the differential amplification circuit 10. The output currents I1, I2 and I3 of the circuits constructing the gain control circuit 20 are obtained by proper adjustment in response to the first to third individual control input signals VCLS1 to VCLS3 derived as signals each having a predetermined inclination and a predetermined offset value by shifting the level of the control input signal VCNT by the level shifting circuit 21. The output currents I1, I2 and I3 are adjusted so that the sum of the output currents I1, I2 and I3 has: a linear characteristic in a voltage level region (1) in which the control input signal VCNT is small; a monotone increase characteristic of which curve opens upwards in an intermediate voltage level region (2); and a monotone increase characteristic of which curve opens upwards sharper than that in the region (2) in a high voltage level region (3). The sum of the output currents I1, I2 and I3 is converted to a voltage by the load resistors R1 and R2 and the voltage is supplied as the gain controlled signal VAGC to the differential amplification circuit 10.

As shown in FIG. 8B, the gain control signal VAGC in the three regions (1), (2) and (3) matches with the monotone increase region (1) of which curve opens upwards, the linear region (2), and the monotone increase region (3) of which curve opens downwards in the input output characteristics of the differential pair of transistors Tr11 and Tr12 and the differential pair of transistors Tr13 and Tr14 at the second stage in the differential amplification circuit 10, respectively.

That is, in FIGS. 8A and 8B, the region (1) in which the gain control signal VAGC to the control input signal VCNT expresses a linear characteristic matches the monotone increase region (1) of which curve opens upwards in the input output characteristic of the differential amplification circuit 10. By the combination of the characteristics, the power gain response to the control input signal VCNT has therefore a monotone increase characteristic which opens upwards. When the characteristic is expressed in decibels, it is expressed as a linear characteristic. Consequently, linearity of a gain change can be assured. Since the region (2) in which the gain control signal VAGC has a monotone increase characteristic of which curve opens upwards in response to the control input signal VCNT matches the linear region (2) in the input output characteristic of the differential amplification circuit 10, the power gain response to the control input signal VCNT has a monotone increase characteristic of which curve opens upwards by the combination of the characteristics. When the power gain response is expressed in decibels, it has a linear characteristic. Consequently, the linearity of the gain change can be assured. Further, the region (3) in which the gain control signal VAGC to the control input signal VCNT has a monotone increase characteristic of which curve opens upwards more sharply than that in the region (2) matches the region (3) of the monotone increase characteristic of which curve opens downwards in the input output characteristic of the differential amplification circuit 10. The power gain response to the control input signal VCNT therefore has a monotone increase characteristic of which curve opens upwards by the combination of the characteristics. When the power gain response is expressed in decibels, it has a linear characteristic. Consequently, the linearity of the gain change can be assured.

Therefore, only by shifting the level of the control input signal VCNT linearly in accordance with the input output characteristic regions (1), (2) and (3) in the input output characteristics of the differential amplification circuit 10, the power gain change characteristic in response to the control input signal VCNT can be changed so as to be linear. Moreover, the entire input output characteristic region of the differential amplification circuit 10 can be used for the entire input region of the control input signal VCNT. The linearity of the power gain change can be assured over a wide range of the input output characteristics of the differential amplification circuit 10.

As specifically described above, in the gain variable amplifier 100 according to the embodiment, in order to supply the gain control signal VAGO for controlling the gain to the differential pair of transistors Tr11 and Tr12 and the differential pair of transistors Tr13 and Tr14 at the second stage of the differential amplification circuit 10, the gain control circuit 20 comprises: the first differential input circuit having the differential pair of transistors Tr1 and Tr3 in which the transistors Tr2 and Tr4 work as diodes for level shifting are inserted; the second differential input circuit having the pair of the transistor Tr3 whose level is shifted by the transistor Tr4 and the transistor Tr5 for which the transistor that works as a diode for level shifting is not inserted; and the current source circuit having the transistor Tr6 and the emitter resistor R3. The first to third individual control input signals VCLS1 to VCLS3 each obtained by shifting the level of the control input signal VCNT by the level shifting circuit 21 so as to have a predetermined inclination and an offset value are supplied to the above circuits, respectively. The signals can be adjusted so that, for the monotone increase region (1) of which curve opens upwards, the linear region (2), and the monotone increase region (3) of which curve opens downwards in the input output characteristics of the differential pair of Tr11 and Tr12 and the differential pair of Tr13 and Tr14 at the second stage in the differential amplification circuit 10, the input output characteristic of the gain control signal VAGC in the gain control circuit 20 can be adjusted to the linear characteristic in the region (1) in which the level of the control input signal VCNT is low, the monotone increase characteristic of which curve opens upwards in the intermediate level region (2), and the monotone increase characteristic of which curve opens upwards more sharply than that in the region (2) in the high level region (3). Thus, the linearity of the power gain change can be assured over a wide range by using the entire input output regions of the differential pair Tr11 and Tr12 and the differential pair Tr13 and Tr14 at the second stage of the differential amplification circuit 10.

Since the transistors Tr2 and Tr4 that work as diodes are connected in the forward direction to the differential pair of transistors Tr1 and Tr3 in the first differential input circuit in the gain control circuit 20, the high operating point can be set by the level shifting of the amount corresponding to the forward voltage of the diodes, and a high voltage level of the first individual control input signal VCLS1 can be also set. The operating range of the first individual control input signal VCLS1 can be therefore adjusted to the voltage range in which level shifter 21 can perform the level shifting with high accuracy. The operation accuracy of the first differential input circuit in the gain control circuit 20 can be improved.

Further, each of the first to third individual control input signals VCLS1 to VCLS3 is a signal obtained by giving a predetermined inclination and a predetermined offset value to the control input signal VCNT. It is sufficient to linearly shift the level of each of the first to third individual control input signals VCLS1 to VCLS3 in accordance with the control input signal VCNT. The level shifting circuit 21 can be realized by a simple circuit construction having the resistive potential divider as a main component. The level shifting circuit 21 is not necessarily provided in the variable gain amplifier 100. It is also possible to provide the level shifting circuit 21 on the outside and directly supply a signal subjected to the level shifting by the level shifting circuit 21 to the gain control circuit 20 in the variable gain amplifier 100.

Obviously, the invention is not limited to the foregoing embodiment but various improvements and modifications are possible without departing from the gist of the invention.

For example, although the gain control circuit 20 is comprised of the three circuit blocks of the first differential input circuit, the second differential input circuit, and the current source circuit in the embodiment, the invention is not limited to the configuration. The current source circuit may be omitted. Three or more differential input circuits can be also provided. Further, it is also possible to set the level shifting circuit for the operating point by the diodes so as to be larger by connecting diodes at multiple stages. On the contrary, a configuration in which the level shifting is not performed can be also employed. By a proper combination of the circuits and adjustment of the inclination and the offset value of each of the individual control input signals, the gain control signal optimum to obtain the linearity of the gain change characteristic over a wide input output range in accordance with the input output characteristic of the differential pair which sets the gain coefficient in the differential amplification circuit 10 can be easily and certainly generated.

According to the invention, by properly switching the input output characteristic of the gain control circuit in accordance with the input output characteristic of the differential pair circuit which sets the gain coefficient in the differential amplification circuit, the linearity of the power gain change characteristic can be assured over a wide range of the input output characteristic of the differential pair circuit in the differential amplification circuit. The gain variable amplifier having a linear power gain change characteristic over a wide range can be obtained by setting the gain control signal having a linear characteristic for the monotone increase characteristic which opens upwards, the gain control signal having a monotone increase characteristic which opens upwards for the linear characteristic, and the gain control signal having the monotone increase characteristic which opens sharply upwards for the monotone increase characteristic which opens downwards.

What is claimed is:

1. A gain variable amplifier comprising:

a level converter circuit for receiving a control input signal and outputting pluralities of individual input signal in accordance with voltage level of the control input signal;

a gain control circuit having a gain control characteristic of outputting a predetermined gain control signal in accordance with a control input signal; and a differential amplification circuit having an input output characteristic of varying a gain by switching a differential output current passing through a differential pair by the gain control signal;

wherein the gain control circuit includes a plurality of circuits having input output characteristics that are different from one another and each one of the plurality of circuits receives each one of the pluralities of individual input signals corresponding to the voltage level of the control input signal from the level converter circuit and the gain control circuit outputs the predetermined gain control signal.

* * * * *